United States Patent
Otsuki et al.

(10) Patent No.: US 7,291,372 B2
(45) Date of Patent: Nov. 6, 2007

(54) RELEASE PROCESS FILM

(75) Inventors: Junichi Otsuki, Saitama (JP); Makoto Inoue, Saitama (JP)

(73) Assignee: Lintec Corporation, Tokyo (JP)

( * ) Notice: Subject to any disclaimer, the term of this patent is extended or adjusted under 35 U.S.C. 154(b) by 213 days.

(21) Appl. No.: 11/018,779

(22) Filed: Dec. 20, 2004

(65) Prior Publication Data

US 2005/0158502 A1    Jul. 21, 2005

(30) Foreign Application Priority Data

Jan. 16, 2004    (JP)    ............... 2004-009097

(51) Int. Cl.
- *B32B 9/00* (2006.01)
- *B32B 33/00* (2006.01)
- *B32B 7/12* (2006.01)
- *B32B 15/04* (2006.01)

(52) U.S. Cl. .................. 428/40.1; 428/41.5; 428/343; 428/220; 428/337

(58) Field of Classification Search ............... 428/40.1, 428/41.5, 343, 346, 347, 355 AC, 220, 332, 428/337

See application file for complete search history.

(56) References Cited

U.S. PATENT DOCUMENTS

| | | | | |
|---|---|---|---|---|
| 4,937,278 A | * | 6/1990 | Besso | ......................... 524/398 |
| 6,074,729 A | * | 6/2000 | Watanabe et al. | ........... 428/212 |
| 6,602,599 B1 | * | 8/2003 | Toyoda et al. | ........ 428/355 AC |
| 2002/0168517 A1 | * | 11/2002 | Husemann et al. | ... 428/355 AC |

FOREIGN PATENT DOCUMENTS

JP    2000-44896 A    2/2000

* cited by examiner

*Primary Examiner*—Patricia L Nordmeyer
(74) *Attorney, Agent, or Firm*—Frishauf, Holtz, Goodman & Chick, P.C.

(57) ABSTRACT

A release process film which comprises a base material film and an adhesive layer disposed on one face of the base material film and is used by attaching to a flexible printed circuit board, wherein the adhesive layer is formed with an adhesive comprising an acrylate-based copolymer at least comprising 40 to 99% by mass of a butyl acrylate unit and 1 to 20% by mass of a monomer unit having a crosslinking functional group and a crosslinking agent and the film has specific properties. The film can effectively suppress contamination of the surface of a printed circuit board with solvents and foreign substances and formation of flaws on the surface in the process using the flexible printed circuit board for producing electronic and electric instruments.

36 Claims, No Drawings

RELEASE PROCESS FILM

BACKGROUND OF THE INVENTION

1. Field of the Invention

The present invention relates to a release process film used by attaching to a flexible printed circuit board. More specifically, the present invention relates to a release process film which is attached to the surface of a flexible printed circuit board, effectively suppresses contamination of the surface of a printed circuit board with solvents and foreign substances and formation of flaws on the surface, leaves little adhesive residue on the adherend after being peeled off and suppresses curling of the adherend in the process for producing electric and electronic instruments by mounting electric and electronic members to the flexible printed circuit board.

2. Description of Related Art

A printed circuit board is a circuit board having a circuit pattern of a conductive material which is necessary for connecting electric and electronic members mounted on the board and formed by printing on the surface of or on the surface and at the inside of an insulating substrate. The printed circuit board has the function of electrically connecting electric and electronic members mounted in electric and electronic instruments through the circuit.

From the standpoint of the form, the printed circuit board can be classified into rigid printed circuit boards and flexible printed circuit boards. From the standpoint of the structure, the printed circuit board can be classified into single layer, multi-layer, i.e., having two or more layers, and flexible printed circuit boards. From the standpoint of the application, most of the printed circuit boards for instruments of household applications are single layer printed circuit boards, and most of the printed circuit boards for instruments for industrial applications are multi-layer printed circuit boards.

Among the above printed circuit boards, the flexible printed circuit board is obtained by forming a circuit pattern of a conductive material on an insulating substrate having excellent flexibility and is indispensable for steric high density mounting in a narrow space having a complicated structure at the inside of electronic instruments. The flexible printed circuit board is one of members of electronic instruments which are most useful for satisfying the recent requirements for the electronic instruments to decrease the size and the weight and increase the density and the accuracy, and the demand for the flexible printed circuit board is rapidly increasing.

Since flexibility is required for the above flexible printed circuit board, a plastic sheet exhibiting excellent heat resistance and electric insulation such as a polyimide sheet and a polyphenylene sulfide sheet is used as the insulating substrate, and a circuit pattern is formed on the surface of or on the surface and at the inside of the insulating substrate with a metal material such as copper. The important properties required for the flexible printed circuit board are, for example, dimensional accuracy, small degrees of curling and twisting, heat resistance, peeling strength, bending strength, volume resistivity, surface resistance of the adhesive, chemical resistance, bending strength under heating, holding power and properties suitable for working as a printed circuit board.

To the above flexible printed circuit board, in general, a release process film is attached in advance before electric and electronic members are mounted so that contamination with solvents and foreign substances and formation of flaws are suppressed in the process for producing the electric and electronic instruments by mounting the electric and electronic members. In the process film, an adhesive layer which can be released is disposed on one face of the base material film. After the process film is attached to the flexible printed circuit board, the flexible printed circuit is treated in various processes such as die cutting, dipping into a solvent and heat pressing, and the process film is thereafter peeled off the flexible printed circuit board. Therefore, it is important that lifting or peeling of the process film does not take place in the above processes and the process film exhibits the release property such that no adhesive residue is left on the adherend and curling of the adherend does not take place after the process film is peeled off.

As the release adhesive film, for example, heat resistant release adhesive films having an adhesive layer formed by using an acrylic adhesive of the crosslinking type containing an aliphatic polyisocyanate as the crosslinking agent are disclosed (for example, Japanese Patent Application Laid-Open No. 2000-44896). In the acrylic adhesive of the crosslinking type, in general, a material containing 2-ethylhexyl acrylate unit as the main component is frequently used as the resin component so that the excellent release property is obtained. However, the acrylic adhesive of the crosslinking type using a resin composition containing 2-ethylhexyl acrylate as the main component described above has a drawback in that, when an adhesive film using the adhesive is attached to a flexible printed circuit board as the process film, shear occasionally takes place between the adhesive film and the flexible printed circuit board during the heat pressing operation to cause disorder in the dimension and, as the result, it becomes difficult that the accurate electric circuit is obtained.

SUMMARY OF THE INVENTION

Under above circumstances, the present invention has an object of providing a release process film which is attached to the surface of a flexible printed circuit board, does not cause shear, lifting or peeling, effectively suppresses contamination of the surface of the printed circuit board with solvents and foreign substances and formation of flaws on the surface, leaves little adhesive residue on the adherend after being peeled off and suppresses curling of the adherend in the process for producing electric and electronic instruments by mounting electric and electronic members to the flexible printed circuit board.

As the result of intensive studies by the present inventors to develop the release process film having the above excellent properties, it was found that the object could be achieved by a release process film which was prepared by disposing an adhesive layer having specific properties on one face of a base material film using an adhesive containing an acrylate-based copolymer having a specific composition and a crosslinking agent or by a release process film further having a release liner disposed on the adhesive layer of the above release process film. The present invention has been completed based on the knowledge.

The present invention provides:

(1) A release process film which comprises a base material film and an adhesive layer disposed on one face of the base material film and is used by attaching to a flexible printed circuit board, wherein, (a) the adhesive layer is formed with an adhesive which comprises an acrylate-based copolymer at least comprising 40 to 99% by mass of a butyl acrylate unit and 1 to 20% by mass of a monomer unit having a crosslinking functional group and a crosslinking agent;

(b) a holding power to a plastic sheet used for the flexible printed circuit board of an adherend is 70,000 seconds or greater as measured in accordance with a method of Japanese Industrial Standard Z0237;

(c) an adhesive strength to the plastic sheet used for the flexible printed circuit board of the adherend is 0.05 to 2.0 N/25 mm as measured in accordance with a method of Japanese Industrial Standard Z0237 before being heat pressed;

(d) an adhesive strength to the plastic sheet used for the flexible printed circuit board of the adherend is 0.1 to 4.0 N/25 mm as measured in accordance with a method of Japanese Industrial Standard Z0237 after being attached to the plastic sheet and heat pressed for 30 minutes under a condition of a temperature of 180° C. and a pressure of 4.3 N/mm$^2$; and (e) a gel fraction is 90% or greater;

(2) A release process film described in (1), wherein the monomer unit having a crosslinking functional group is a monomer unit having hydroxyl group;

(3) A release process film described in any one of (1) and (2), which further comprises a release liner disposed on the adhesive layer;

(4) A release process film described in any one of (1) to (3), wherein an amount of a residual solvent in the adhesive layer is 2 μg/cm$^2$ or less; and (5) A release process film described in any one of (1) to (4), wherein the flexible printed circuit board is obtained by using a polyimide sheet or a polyphenylene sulfide sheet.

DESCRIPTION OF THE PREFERRED EMBODIMENTS

The release process film of the present invention comprises a base material film and an adhesive layer disposed on one face of the base material film and is used as the process film by attaching to a flexible printed circuit board.

As the base material film for the process film, it is important that the film has excellent heat resistance. Examples of the base material film include polyethylene terephthalate films, polycarbonate films, amorphous polyolefin films, aramide films, polyethylene naphthalate films, polyphenylene sulfide films and super engineering plastic films such as aromatic polysulfone films, polyether imide films, polyarylate films, polyether ether ketone films and various types of liquid crystal polymer films. Among these films, polyethylene terephthalate films are preferable from the standpoint of the mechanical properties, electric insulation, the barrier property, heat resistance, chemical resistance and economy. The thickness of the base material film is not particularly limited. The thickness is, in general, in the range of 16 to 200 μm and preferably in the range of 25 to 100 μm.

In the base material film, where desired, at least the face for disposing the adhesive layer may be subjected to a surface treatment such as the oxidation treatment and the roughening treatment to enhance adhesion to the adhesive layer. The surface may be treated with a primer. Examples of the oxidation treatment include the treatment by corona discharge, the treatment with plasma, the treatment with chromic acid (a wet process), the treatment with flame, the treatment with heated air or irradiation with ultraviolet light in the presence of ozone. Examples of the roughening treatment include the sandblasting treatment and the treatments with solvents. The surface treatment is suitably selected in accordance with the type of the base material film. In general, the treatment by corona discharge is preferable from the standpoint of the effect and the operability.

In the release process film of the present invention, the adhesive layer disposed on one face of the above base material film is formed with an adhesive which comprises an acrylate-based copolymer at least comprising 40 to 99% by mass of a butyl acrylate unit and 1 to 20% by mass of a monomer unit having a crosslinking functional group and a crosslinking agent.

When the acrylate-based copolymer of the resin component of the adhesive comprises 40 to 99% by mass of the butyl acrylate unit, shear between the flexible printed circuit board and the process film is suppressed when the process film is attached to the flexible printed circuit board and, for example, is heat pressed. It is preferable that the content of the butyl acrylate unit is 50 to 99% by mass and more preferably 65 to 99% by mass.

Examples of the monomer forming the monomer unit having a crosslinking functional group include hydroxyalkyl esters of (meth)acrylic acid such as 2-hydroxyethyl(meth)acrylate, 2-hydroxypropyl (meth)acrylate, 3-hydroxypropyl (meth)acrylate, 2-hydroxybutyl (meth)acrylate, 3-hydroxybutyl(meth)acrylate and 4-hydroxybutyl (meth)acrylate; monoalkylaminoalkyl(meth)acrylates such as monomethylaminoethyl(meth)acrylate, monoethylaminoethyl (meth) acrylate, monomethylaminopropyl(meth)acrylate and monoethylaminopropyl(meth)acrylate; and ethylenically unsaturated carboxylic acids such as acrylic acid, methacrylic acid, crotonic acid, maleic acid, itaconic acid and citraconic acid. The above monomer may be used singly or in combination of two or more. Among the above monomers, hydroxyalkyl esters of (meth)acrylic acid which are monomers having hydroxyl group are preferable from the standpoint of the crosslinking property and the properties of the adhesive layer. In the acrylate-based copolymer, the content of the monomer unit having the crosslinking functional group is 1 to 20% by mass and more preferably 5 to 15% by mass.

In the above acrylate-based copolymer, where desired, other monomers copolymerizable with the above monomer may be used for the component of the copolymer. Examples of the other monomer include esters of (meth)acrylic acid having an alkyl group having 1 to 20 carbon atoms in the ester group other than butyl acrylate such as methyl (meth) acrylate, ethyl(meth)acrylate, propyl(meth)acrylate, butyl methacrylate, pentyl(meth)acrylate, hexyl(meth)acrylate, cyclohexyl (meth)acrylate, 2-ethylhexyl(meth)acrylate, isooctyl(meth)acrylate, decyl (meth)acrylate, dodecyl(meth) acrylate, myristyl(meth)acrylate, palmityl (meth)acrylate and stearyl(meth)acrylate; vinyl esters such as vinyl acetate and vinyl propionate; olefins such as ethylene, propylene and isobutylene; halogenated olefins such as vinyl chloride and vinylidene chloride; styrene-based monomers such as styrene and α-methylstyrene; diene-based monomers such as butadiene, isoprene and chloroprene; nitrile-based monomers such as acrylonitrile and methacrylonitrile; and acrylamides such as acrylamide, N-methylacrylamide and N,N-dimethyl-acrylamide. The other monomer may be used singly or in combination of two or more. Among the other monomers described above which is used where desired, methyl methacrylate is preferable from the standpoint of the increase in cohesive force and excellent control of adhesive strength and feel of tacking.

In the present invention, the form of the above acrylate-based copolymer is not particularly limited and may be any of the random copolymer, the block copolymer and the graft copolymer. It is preferable that the weight-average molecular weight is 300,000 or greater and more preferably in the range of 500,000 to 2,000,000.

The above weight-average molecular weight is the value obtained in accordance with the gel permeation chromatography (GPC) and expressed as the value of the corresponding polystyrene.

In the adhesive used in the present invention, a single type or a combination of two or more types of the acrylate-based copolymer may be used.

The crosslinking agent used in the adhesive is not particularly limited and can be suitably selected as desired from crosslinking agents conventionally used in acrylic adhesives. Examples of the crosslinking agent include polyisocyanate-based crosslinking agents, epoxy resin-based crosslinking agents, melamine resin-based crosslinking agents, urea resin-based crosslinking agents, dialdehyde-based crosslinking agents, methylol polymer-based crosslinking agents, aziridine-based crosslinking agents, metal chelate-based crosslinking agents, metal alkoxide-based crosslinking agents and metal salt-based crosslinking agents. Among these crosslinking agents, polyisocyanate-based crosslinking agents are preferable from the standpoint of close adhesion to the base material film.

Examples of the polyisocyanate-based crosslinking agent include aromatic polyisocyanate crosslinking agents such as tolylene diisocyanate-based crosslinking agents, diphenylmethane diisocyanate-based crosslinking agents and xylylene diisocyanate-based crosslinking agents; aliphatic polyisocyanate-based crosslinking agents such as hexamethylene diisocyanate-based crosslinking agents; alicyclic polyisocyanate crosslinking agents such as isophorone diisocyanate-based and hydrogenated diphenylmethane diisocyanate-based crosslinking agents; and crosslinking agents based on biuret compounds and isocyanurates of the above isocyanates and adducts of the above isocyanates which are reaction products with low molecular weight compounds having active hydrogen such as ethylene glycol, propylene glycol, neopentyl glycol, trimethylolpropane and caster oil.

Among the above polyisocyanate-based crosslinking agents, tolylene diisocyanate-based crosslinking agents are preferable from the standpoint of the heat of reaction and the suitable adhesive force obtained after heat curing. It is preferable that a metal chelate-based crosslinking agent is used in combination so that the process film can be attached to the flexible printed circuit board immediately after the formation of the adhesive layer (immediately after the drying).

In the present invention, the crosslinking agent may be used singly or in combination of two or more. The amount of the crosslinking agent is selected, in general, in the range of 0.01 to 30 parts by mass and preferably in the range of 0.1 to 20 parts by mass per 100 parts by mass of the above acrylate-based copolymer so that the adhesive layer having the properties described below is obtained although the amount may be different depending on the type of the crosslinking agent.

To the adhesive, various additives conventionally used for acrylic adhesives such as tackifiers, antioxidants, ultraviolet light absorbents, photostabilizers, softeners, fillers and crosslinking accelerators may be added as long as the object of the present invention is not adversely affected.

In the present invention, the degree of crosslinking can be controlled by suitably selecting the type and the amount of the crosslinking agent described above and the condition of crosslinking, and the adhesive layer having the properties described in the following can be formed.

In the release process film of the present invention, the adhesive layer formed by using the above adhesive has the following properties.

The holding power to the plastic sheet used for the flexible printed circuit board of the adherend is 70,000 or greater. When the holding power is smaller than 70,000, there is the possibility that shear takes place between the process film and the adherend during operations such as attaching the process film to the printed circuit board of the adherend, die cutting, dipping into a solvent and heat pressing. The holding power is obtained in accordance with the following method.

<Holding Power>

In accordance with the method of Japanese Industrial Standard Z0237, a test plate (an adherend) which is a plastic sheet used for the flexible printed circuit board and a test piece (a process film) are cut into pieces having a width of 25 mm and a length of 75 mm. An end portion of the test piece obtained by the cutting is attached to an end portion of the test plate obtained by the cutting in a manner such that a portion of the adhesive layer having an area of 25 mm×25 mm is brought into contact with the test plate. The test plate and the test piece are adhered together by pressing by a roller of 25 kg in five reciprocal movements. After 15 minutes, the resultant combination is set to a creep tester and left standing for 15 minutes at 40° C. Then, a load of 9.807 N is applied downward in the vertical direction. The time before shear takes place is obtained by visual observation and used as the holding power.

The adhesive strength to the plastic sheet used for the flexible printed circuit board of the adherend is 0.05 to 2.0 N/25 mm before being heat pressed and 0.1 to 4.0 N/25 mm after being heat pressed for 30 minutes under the condition of a temperature of 180° C. and a pressure of 4.3 N/mm$^2$. When the adhesive strength before the heat pressing is within the above range, the sufficient adhesive strength is exhibited when the process film is attached to the printed circuit board of the adherend and subjected to operations not accompanied with heat pressing such as die cutting and dipping into a solvent, and shear between the process film and the adherend is suppressed. Moreover, the process film is easily peeled off, and formation of the adhesive residue and curling of the adherend after the peeling can be suppressed. It is preferable that the adhesive strength before the heat pressing is 0.1 to 1.0 N/25 mm. When the adhesive strength after the heat pressing is within the above range, the sufficient adhesive strength is exhibited when the process film is attached to the printed circuit board of the adherend and subjected to the operation of heat pressing, the sufficient adhesive strength is exhibited, and shear between the process film and the adherend is suppressed. Moreover, the process film is relatively easily peeled off, and formation of the adhesive residue and curling of the adherend after the peeling can be suppressed. It is preferable that the adhesive strength after the heat pressing is 0.2 to 3.0 N/25 mm. The adhesive strengths before and after the heat pressing are obtained in accordance with the following methods.

<Adhesive Strength before Heat Pressing>

In accordance with the method of Japanese Industrial Standard Z0237, a plastic sheet used for the flexible printed circuit board is cut into a piece having a width of 120 mm and a length of 150 mm and used as the test plate (the adherend). A process film is cut into a piece having a width of 25 mm and a length of 250 mm and used as the test piece.

An end portion of the test piece obtained by the cutting is attached to an end portion of the test plate obtained by the cutting in a manner such that a portion of the adhesive layer having an area of a width of 25 mm×a length of about 90 mm is brought into contact with the test plate. The test plate and the test piece are adhered together by pressing by a roller of 2 kg in one reciprocal movement. Twenty four hours after being attached, the test piece is peeled at a peeling angle of 180 degrees and a peeling speed of 300 mm/min, and the adhesive strength is measured. The average in the portion of 70% at the central portion of the chart is used as the adhesive strength before the heat pressing.

<Adhesive Strength after Heat Pressing>

A plastic sheet used for the flexible printed circuit board is cut into a piece having a width of 120 mm and a length of 150 mm and used as the test plate (the adherend). A process film is cut into a piece having a width of 100 mm and a length of 250 mm and used as the test piece. An end portion of the test piece obtained by the cutting is attached to an end portion of the test plate obtained by the cutting in a manner such that a portion of the adhesive layer having an area of a width of 100 mm×a length of about 90 mm is brought into contact with the test plate. The combination of the test plate and the test piece are heat pressed for 30 minutes at a temperature of 180° C. under a pressure of 4.3 N/mm² applied to the test piece. Using the combination obtained by attaching the test piece to the test plate by heat pressing is cut into a piece having a width of 25 mm and a length of 250 mm, and the adhesive strength in peeling the test piece at a peeling angle of 180° C. at a peeling speed of 300 mm/min is measured in accordance with the method of Japanese Industrial Standard Z0237. The average in the portion of 70% at the central portion of the chart is used as the adhesive strength after the heat pressing.

The release process film of the present invention has a gel fraction of 90% or greater in the adhesive layer. When the gel fraction is smaller than 90%, the adhesive residue tends to be formed when the process film is peeled off after the face of the process film having the adhesive layer is attached to the printed circuit board and the obtained combination is subjected to various operations, and this causes contamination of the adherend. Moreover, shear between the process film and the adherend tends to take place in the heat pressing, and this causes a problem in that the accuracy of printing of the circuit decreases. It is preferable that the gel fraction is 94% or greater. The gel fraction is measured in accordance with the following method.

<Measurement of Gel Fraction>

A release film obtained by coating a polyethylene terephthalate film having a thickness of 25 μm with a silicone resin as the release agent is used, and the face of the release film having the release layer is coated with the adhesive. After the adhesive is crosslinked under the same condition as that for preparation of the release process film of the present invention, sheets (50 mm×100 mm) of the crosslinked adhesive are peeled off the release film. Two sheets of the crosslinked adhesive (the total weight: A g) are placed on a metal net of 200 mesh having a size of 100×130 mm and wrapped with the metal net. The obtained wrapped specimen is set into a Soxhlet extractor and treated by extraction with ethyl acetate for 16 hours under the refluxing condition. After the extraction, the sheets of the adhesive remaining on the metal net are dried at 100° C. for 24 hours, and the mass of the adhesive (B g) is measured after the moisture adjustment for 3 hours or longer under the condition of 23° C. and 50% RH. The gel fraction is calculated in accordance with the following equation:

$$\text{gel fraction (\%)}=(B/A)\times 100$$

It is preferable that the amount of the residual solvent in the adhesive layer of the release process film of the present invention is 2 μg/cm² or less. When the amount of the residual solvent exceeds 2 μg/cm², the residual solvent causes flaws on electric and electronic members mounted on the printed circuit board and deterioration in the environment of the operation. Moreover, the residual solvent causes shear between the process film and the printed circuit board in the heat pressing and a decrease in the accuracy of printing the circuit. The amount of the residual solvent is measured in accordance with the following method.

<Residual Solvent>

The amount of the residual solvent is measured in accordance with the purge & trap gas chromatography mass analysis. A specimen is sealed into an ampoule. The ampoule is heated at 120° C. for 10 minutes by a purge & trap [manufactured by NIPPON DENSHI KOGYO Co., Ltd.; JHS-100A], and the formed gas is collected. The obtained gas is then introduced into a gas chromatography mass spectrometer [manufactured by PERKIN ELMER Company; TURBO MASS], and the amount of the formed gas is obtained and expressed as the amount of n-decane.

In the release process film of the present invention, it is preferable that the shear is 50 μm or smaller and more preferably 30 μm or smaller when the process film is attached to the plastic sheet used for the flexible printed circuit board of the adherend and heat pressed for 30 minutes under the condition of 180° C. and 4.3 N/mm². The shear in the heat pressing is measured in accordance with the following method.

<Shear in Heat Pressing>

A plastic sheet used for the flexible printed circuit board which has been cut into the size of 22 cm×22 cm is used as the test plate (the adherend). The face having an adhesive layer of a process film cut into the size of 20 cm×20 cm is attached to the adherend in a manner such that no bubbles are contained, and through holes having a diameter of 6 mm are formed at the four corners. After the obtained piece is heat pressed for 30 minutes under the condition of a temperature of 180° C. and a pressure of 4.3 N/mm², the shear between the process film and the adherend is measured at the four corners. The average of the obtained values is used as the shear.

The release process film of the present invention is attached to the plastic sheet used for the flexible printed circuit board. There are two embodiments in the method of using the film: (1) a method in which the adhesive is applied to the base material film and dried by heating to form the adhesive layer, and the obtained laminate is directly attached to the plastic sheet used for the printed circuit board; and (2) a method in which, after the adhesive layer is formed as described in (1), a release liner is placed on the adhesive layer, the release liner is peeled off after storage or transportation, and the process film is used by attaching to the plastic sheet used for the printed circuit board.

Therefore, the process film may be prepared by forming the adhesive layer by directly applying the adhesive used in the present invention to one face of the base material film and drying the applied adhesive by heating at about 100 to 130° C. for about 1 to 5 minutes so that the amount of the residual solvent is preferably 2 μg/cm² or less, and the prepared process film may be attached to the plastic film used for the flexible printed circuit board. Alternatively, the process film may be formed by placing a release liner on the adhesive layer obtained after the drying by heating as described above, and the process film may be attached to the plastic sheet used for the printed circuit board after the release liner is peeled off at the time of the use.

The process film having the release liner may also be produced as follows: the adhesive is applied to the face treated for release of a release liner and is dried by heating as described above to form the adhesive layer, and the formed adhesive layer is transferred to one face of the base material film by attaching the release liner having the adhesive layer. When the release liner is left remaining without being peeled off, the process film having the release liner can be obtained.

The thickness of the adhesive layer in the release process film of the present invention is, in general, about 5 to 100 μm and preferably about 10 to 60 μm.

Examples of the release liner described above include release liners obtained by coating paper base materials such as glassine paper, coated paper and cast coated paper, a laminate paper obtained by laminating these paper base materials with thermoplastic resins such as polyethylene and plastic films, examples of which include polyester films such as polyethylene terephthalate films, polybutylene terephthalate films and polyethylene naphthalate films, and polyolefin films such as polypropylene films and polyethylene films, with release liners such as silicone resins. The thickness of the release liner is not particularly limited. The thickness is, in general, about 20 to 150 μm.

The type of the flexible printed circuit board to which the release process film of the present invention is applied is not particularly limited. In general, sheets of heat resistant plastics such as polyimides and polyphenylene sulfide are used for the flexible printed circuit board.

To summarize the advantages obtained by the invention, in accordance with the present invention, the release process film which is attached to the surface of a flexible printed circuit board, does not cause shear, lifting or peeling, effectively suppresses contamination of the surface of the printed circuit board with solvents and foreign substances and formation of flaws on the surface, leaves little adhesive residue on the adherend after being peeled off and suppresses curling of the adherend in the process for producing electric and electronic instruments by mounting electric and electronic members to the flexible printed circuit board, can be provided.

EXAMPLES

The present invention will be described more specifically with reference to examples in the following. However, the present invention is not limited to the examples.

The properties of the process films obtained in the Examples and Comparative Examples were evaluated in accordance with the following methods.

(1) Adhesion between an Adhesive Layer and a Base Material Film

The adhesion between an adhesive layer and a base material film in the process film was evaluated in accordance with the method of Japanese Industrial Standard K5600-5-6. An adhesive layer on a laminate of the adhesive layer and a base material film was cut by a rotary cutter in the form of a grid to form 100 portions of 1 mm square on the surface, and an adhesion tape (CELLOTAPE; a registered trade name; manufactured by NICHIBAN Co., Ltd.) was attached to the adhesive layer under pressure. The attached adhesion tape was peeled at an angle of about 60° in 0.5 to 1.0 second. The number of the portion remaining on the base material film was counted. The adhesion was evaluated in accordance with the following criteria:

| | |
|---|---|
| 90/100 or more: | 5 |
| 80/100 to less than 90/100: | 4 |
| 70/100 to less than 80/100: | 3 |
| 60/100 to less than 70/100: | 2 |
| less than 60/100: | 1 |

(2) Adhesive Residue

Using a plastic sheet used for the flexible printed circuit board which had been cut into the size of 22 cm×22 cm as the test plate (the adherend), the face having an adhesive layer of a process film cut into the size of 20 cm×20 cm was attached to the adherend in a manner such that no bubbles were contained. After the obtained laminate was heat pressed for 30 minutes under the condition of a temperature of 180° C. and a pressure of 4.3 N/mm$^2$, the process film was peeled off. The surface of the test plate was examined by the IR measurement in accordance with the Fourier transform infrared absorption spectroscopy (FT-IR; the ATR method), and it was examined whether the adhesive residue was present or absent based on the presence or the absence, respectively, of the absorption peak derived from the adhesive. The result is expressed as "present" or "absent", respectively.

The holding power, the adhesive strength before and after the heat pressing, the shear after the heat pressing, the residual solvent and the gel fraction of the adhesive layer were measured in accordance with the methods described above.

Example 1

The solution polymerization was conducted under the atmosphere of nitrogen gas using 70 parts by mass of butyl acrylate (BA), 20 parts by mass of methyl methacrylate, 10 parts by mass of 2-hydroxyethyl methacrylate (HEMA) and benzoyl peroxide (BPO) as the polymerization initiator and adding ethyl acetate as the solvent in a reactor equipped with a thermometer, a stirrer, a reflex condenser and an inlet for nitrogen gas, and an acrylate-based copolymer having a solid content of 40% by mass and a weight-average molecular weight of 800,000 was prepared.

To 100 parts by mass of the acrylate-based copolymer prepared above, 7 parts by mass of a tolylene diisocyanate-based (TDI-based) crosslinking agent [manufactured by TOYO INK SEIZO Co., Ltd.; the trade name: "ORIBAIN BHS8515"; the solid content: 37.5% by mass] and 5 parts by mass of a metal chelate-based crosslinking agent [manufactured by SOKEN KAGAKU Co., Ltd.; the trade name: "M-5A"; the solid content: 5% by mass] were added, and an adhesive was prepared.

To one face of a polyethylene terephthalate (PET) film having a thickness of 50 μm [manufactured by TORAY Co., Ltd.; the trade name: "PET 50T-60 TORAY"], the adhesive prepared above was directly applied in an amount such that the amount after being dried was 14 g/m$^2$ (the thickness: 14 μm) to form an adhesive layer, which was then dried at 120° C. for 1 minute. A release liner [manufactured by OJI SEISHI Co., Ltd.; the trade name: "PP40SD-001"] was laminated to the dried adhesive layer, and a process film was prepared. The properties of the obtained process film were evaluated. As the test plate (the adherend), a polyimide sheet was used. The results of the evaluation are shown in Table 1.

Example 2

An acrylate-based copolymer having a solid content of 40% by mass and a weight-average molecular weight of 800,000 was prepared in accordance with the same procedures as those conducted in Example 1 except that 3-hydroxypropyl methacrylate (HPMA) was used in place of HEMA used in Example 1.

To 100 parts by mass of the acrylate-based copolymer prepared above, 7 parts by mass of a tolylene diisocyanate-based (TDI-based) crosslinking agent [manufactured by TOYO INK SEIZO Co., Ltd.; the trade name: "ORIBAIN BHS8515"; the solid content: 37.5% by mass] and 5 parts by weight of a metal chelate-based crosslinking agent [manufactured by SOKEN KAGAKU Co., Ltd.; the trade name: "M-5A"; the solid content: 5% by mass] were added, and an adhesive was prepared.

To one face of a polyethylene terephthalate (PET) film having a thickness of 50 μm [manufactured by TORAY Co., Ltd.; the trade name: "PET 50T-60 TORAY"], the adhesive prepared above was directly applied in an amount such that the amount after being dried was 14 g/m² (the thickness: 14 μm) to form an adhesive layer, which was then dried at 120° C. for 1 minute. A release liner [manufactured by OJI SEISHI Co., Ltd.; the trade name: "PP40SD-001"] was laminated to the dried adhesive layer, and a process film was prepared. The properties are shown in Table 1.

Example 3

A process film was prepared in accordance with the same procedures as those conducted in Example 1 except that "ORIBAIN BHS8515" (described above) of the TDI-based crosslinking agent alone was used as the crosslinking agent, and "M-5A" (described above) of the metal chelate-based crosslinking agent was not used. The properties are shown in Table 1.

Comparative Example 1

A process film was prepared in accordance with the same procedures as those conducted in Example 1 except that 2-ethylhexyl acrylate (2EHA) was used in place of BA used in Example 1. The properties are shown in Table 1.

TABLE 1

|  | Example | | | Comparative Example |
|---|---|---|---|---|
|  | 1 | 2 | 3 | 1 |
| Main monomer | BA | BA | BA | 2EHA |
| amount (part by mass) | 70 | 70 | 70 | 70 |
| Comonomer | MMA | MMA | MMA | MMA |
| amount (part by mass) | 20 | 20 | 20 | 20 |
| Monomer having functional group | HEMA | HPMA | HEMA | HEMA |
| amount (part by mass) | 10 | 10 | 10 | 10 |

TABLE 1-continued

|  | Example | | | Comparative Example |
|---|---|---|---|---|
|  | 1 | 2 | 3 | 1 |
| Crosslinking agents | | | | |
| type | TDI-based | TDI-based | TDI-based | TDI-based |
| amount (part by mass) | 7 | 7 | 7 | 7 |
| type | metal chelate-based | metal chelate-based | — | metal chelate-based |
| amount (part by mass) | 5 | 5 |  | 5 |
| Holding power (second) | ≧70,000 no shear | ≧70,000 no shear | ≧70,000 no shear | ≧70,000 no shear |
| Adhesive strength (N/25 mm) | | | | |
| before heat pressing | 0.22 | 0.24 | 0.28 | 0.29 |
| after heat pressing | 2.04 | 2.12 | 2.16 | 4.42 |
| Adhesion with substrate | 5 | 5 | 5 | 5 |
| Adhesive residue | absent | absent | absent | absent |
| Residual solvent (μg/cm²) | 1.28 | 1.42 | 1.31 | 1.36 |
| gel fraction (%) | 95.5 | 95.1 | 94.7 | 94.6 |
| Shear after heat pressing (μm) | 0 | 0 | 0 | 180 |

Example 4

A process film was prepared in accordance with the same procedures as those conducted in Example 1 except that 10 parts by mass of "ORIBAIN BHS8515" (described above) of the TDI-based crosslinking agent, 10 parts by mass of "M-5A" (described above) of the metal chelate-based crosslinking agent were used, and no release liner was laminated to the adhesive layer. As the test plate (the adherend), a polyphenylene sulfide sheet was used. The properties are shown in Table 2.

Example 5

A process film was prepared in accordance with the same procedures as those conducted in Example 4 except that HPMA was used in place of HEMA used in Example 4. The properties are shown in Table 2.

Comparative Example 2

A process film was prepared in accordance with the same procedures as those conducted in Example 4 except that 2-EHA was used in place of BA used in Example 4. The properties are shown in Table 2.

TABLE 2

|  | Example | | Comparative Example |
|---|---|---|---|
|  | 4 | 5 | 2 |
| Main monomer | BA | BA | 2EHA |
| amount (part by mass) | 70 | 70 | 70 |
| Comonomer | MMA | MMA | MMA |
| amount (part by mass) | 20 | 20 | 20 |
| Monomer having functional group | HEMA | HPMA | HEMA |
| amount (part by mass) | 10 | 10 | 10 |

TABLE 2-continued

|  | Example | | Comparative Example |
| --- | --- | --- | --- |
|  | 4 | 5 | 2 |
| Crosslinking agents |  |  |  |
| type | TDI-based | TDI-based | TDI-based |
| amount (part by mass) | 10 | 10 | 10 |
| type | metal chelate-based | metal chelate-based | metal chelate-based |
| amount (part by mass) | 10 | 10 | 10 |
| Holding power (second) | ≧70,000 no shear | ≧70,000 no shear | ≧70,000 no shear |
| Adhesive strength (N/25 mm) |  |  |  |
| before heat pressing | 0.25 | 0.31 | 0.52 |
| after heat pressing | 0.47 | 0.50 | 1.48 |
| Adhesion with substrate | 5 | 5 | 5 |
| Adhesive residue | absent | absent | absent |
| Residual solvent (μg/cm²) | 1.37 | 1.41 | 1.35 |
| gel fraction (%) | 95.7 | 95.6 | 94.5 |
| Shear after heat pressing (μm) | 0 | 0 | 257 |

What is claimed is:

1. A release process film consisting of a base material film and an adhesive layer disposed on one face of the base material film, and is used by attaching the release process film to a flexible printed circuit board comprising a plastic sheet, the release process film being operable to adhere to the plastic sheet, wherein said base material film is a film selected from the group consisting of polyethylene terephthalate film, polycarbonate film, amorphous polyolefin film, aramide film, polyethylene naphthalate film, polyphenylene sulfide film, aromatic polysulfone film, polyether imide film, polyarylate film, polyether ether ketone film; the base material film having a thickness of 16 to 200 μm and said adhesive layer has the following features:
   (a) the adhesive layer comprises an adhesive which comprises at least one acrylate-based copolymer comprising 40 to 99% by mass of a butyl acrylate unit and 1 to 20% by mass of at least one monomer unit having a crosslinking functional group and at least one crosslinking agent;
   (b) the adhesive layer having a gel fraction of 90% or greater;
   (c)) a holding power to the plastic sheet as an adherend is 70,000 seconds or greater as measured in accordance with a method of Japanese Industrial Standard Z0237;
   (d) an adhesive strength to the plastic sheet as an adherend is 0.05 to 2.0 N/25 mm as measured in accordance with a method of Japanese Industrial Standard Z0237 before being heat pressed;
   (e) an adhesive strength to the plastic sheet as an adherend is 0.1 to 4.0 N/25 mm as measured in accordance with a method of Japanese Industrial Standard Z0237 after being attached to the plastic sheet and heat pressed for 30 minutes under conditions of a temperature of 180° C. and a pressure of 4.3 N/mm²; and
   (f) a shear value after heat pressing the release process film and the plastic sheet is 50 μm or smaller, said shear value being determined by attaching a face of the adhesive layer of the release process film to the plastic sheet, wherein the release process film has four corners and a size of 20 cm×20 cm and the plastic sheet has a size of 22 cm×22 cm, as an adherend, forming through holes having a diameter of 6 mm in the plastic sheet at the four corners of the release process film, heat pressing the release process film and plastic sheet for 30 minutes under the conditions of a temperature of 180° C. and a pressure of 4.3 N/mm², measuring shears between the release process film and the adherend at the four corners and obtaining an average of measured shears at the four corners as a measurement of the shear value.

2. A release process film according to claim 1, wherein the monomer unit having a crosslinking functional group is a monomer unit having a hydroxyl group.

3. A release process film according to claim 2, which further comprises a release liner disposed on the adhesive layer.

4. A release process film according to claim 3, wherein an amount of a residual solvent in the adhesive layer is 2 μg/cm² or less.

5. A release process film according to claim 4, wherein the plastic sheet is a polyimide sheet or a polyphenylene sulfide sheet.

6. A release process film according to claim 3, wherein the plastic sheet is a polyimide sheet or a polyphenylene sulfide sheet.

7. A release process film according to claim 2, wherein an amount of a residual solvent in the adhesive layer is 2 μg/cm² or less.

8. A release process film according to claim 7, wherein the plastic sheet is a polyimide sheet or a polyphenylene sulfide sheet.

9. A release process film according to claim 2, wherein the plastic sheet is a polyimide sheet or a polyphenylene sulfide sheet.

10. A release process film according to claim 1, which further comprises a release liner disposed on the adhesive layer.

11. A release process film according to claim 10, wherein an amount of a residual solvent in the adhesive layer is 2 μg/cm² or less.

12. A release process film according to claim 11, wherein the plastic sheet is a polyimide sheet or a polyphenylene sulfide sheet.

13. A release process film according to claim 10, wherein the plastic sheet is a polyimide sheet or a polyphenylene sulfide sheet.

14. A release process film according to claim 1, wherein an amount of a residual solvent in the adhesive layer is 2 μg/cm² or less.

15. A release process film according to claim 14, wherein the plastic sheet is a polyimide sheet or a polyphenylene sulfide sheet.

16. A release process film according to claim 1, wherein the plastic sheet is a polyimide sheet or a polyphenylene sulfide sheet.

17. A release process film according to claim 1, wherein the butyl acrylate unit being in a amount of 50 to 99% by mass; a monomer forming the monomer unit having a crosslinking functional group being at least one monomer selected from the group consisting of 2-hydroxyethyl(meth)acrylate, 2-hydroxypropyl(meth)acrylate, 3-hydroxypropyl(meth)acrylate, 2-hydroxybutyl(meth)acrylate, 3-hydroxybutyl(meth)acrylate, 4-hydroxybutyl(meth)acrylate, monomethylaminoethyl(meth)acrylate, monoethylaminoethyl(meth)acrylate, monomethylaminopropyl(meth)acrylate, monoethylaminopropyl(meth)acrylate, acrylic acid, methacrylic acid, crotonic acid, maleic acid, itaconic acid and citraconic acid; the monomer unit having a crosslinking functional group being in an amount of 5 to 15% by mass;

the crosslinking agent being at least one crosslinking agent selected from the group consisting of a polyisocyanate-based crosslinking agent, an epoxy resin-based crosslinking agent, a melamine resin-based crosslinking agent, a urea resin-based crosslinking agent, a dialdehyde-based crosslinking agent, a methylol polymer-based crosslinking agent, an aziridine-based crosslinking agent, a metal chelate-based crosslinking agent, a metal alkoxide-based crosslinking agent and a metal salt-based crosslinking agent; the crosslinking agent being in an amount of 0.01 to 30 parts by mass per 100 parts by mass of the acrylate-based copolymer; and the acrylate-based copolymer having a weight-average molecular weight of 300,000 or greater.

18. A release process film according to claim 17, wherein the monomer forming the monomer unit having a crosslinking functional group is 2-hydroxyethyl methacrylate and the crosslinking agent is a tolylene diisocyanate-based crosslinking agent.

19. A release process film according to claim 17, wherein the monomer forming the monomer unit having a crosslinking functional group is 3-hydroxypropyl methacrylate and the crosslinking agent is a tolylene diisocyanate-based crosslinking agent.

20. A release process film according to claim 1, wherein the base material film comprises a polyethylene terephthalate film; the base material film having a thickness of 25 to 100 μm; the butyl acrylate unit being in an amount of 65 to 99% by mass; a monomer forming the monomer unit having a crosslinking functional group being at least one monomer selected from the group consisting of 2-hydroxyethyl(meth) acrylate, 2-hydroxypropyl(meth)acrylate, 3-hydroxypropyl (meth)acrylate, 2-hydroxybutyl(meth)acrylate, 3-hydroxybutyl(meth)acrylate and 4-hydroxybutyl(meth)acrylate; the crosslinking agent being at least one polyisocyanate-based crosslinking agent selected from the group consisting of a tolylene diisocyanate-based crosslinking agent, a diphenylmethane diisocyanate-based crosslinking agent, a xylylene diisocyanate-based crosslinking agent, a hexamethylene diisocyanate-based crosslinking agent, an isophorone diisocyanate-based crosslinking agent and a hydrogenated diphenylmethane diisocyanate-based crosslinking agent; the crosslinking agent being in an amount of 0.1 to 20 parts by mass per 100 parts by mass of the acrylate-based copolymer; and the acrylate-based copolymer having a weight-average molecular weight of 500,000 to 2,000,000.

21. A release process film according to claim 20, wherein the crosslinking agent comprises a tolylene diisocyanate-based crosslinking agent and a metal chelate-based crosslinking agent.

22. A release process film according to claim 21, wherein the monomer forming the monomer unit having a crosslinking functional group is 2-hydroxyethyl methacrylate.

23. A release process film according to claim 22, wherein the acrylate-based copolymer further comprises methyl methacrylate as another monomer unit.

24. A release process film according to claim 21, wherein the monomer forming the monomer unit having a crosslinking functional group is 3-hydroxypropyl methacrylate.

25. A release process film according to claim 24, wherein the acrylate-based copolymer further comprises methyl methacrylate as another monomer unit.

26. A release process film according to claim 20, wherein the monomer forming the monomer unit having a crosslinking functional group is 2-hydroxyethyl methacrylate and the crosslinking agent is a tolylene diisocyanate-based crosslinking agent.

27. A release process film according to claim 20, wherein the monomer forming the monomer unit having a crosslinking functional group is 3-hydroxypropyl methacrylate and the crosslinking agent is a tolylene diisocyanate-based crosslinking agent.

28. A release process film consisting of a base material film and an adhesive layer disposed on one face of the base material film in combination with a flexible printed circuit board comprising a plastic sheet, said base material film being a film selected from the group consisting of polyethylene terephthalate film, polycarbonate film, amorphous polyolefin film, aramide film, polyethylene naphthalate film, polyphenylene sulfide film, aromatic polysulfone film, polyether imide film, polyarylate film, polyether ether ketone film, the base material film having a thickness of 16 to 200 μm, the plastic sheet being a polyimide sheet or a polyphenylene sulfide sheet, the face of the adhesive layer of the release process film being attached to a face of the flexible printed circuit board, said adhesive layer having the following features:

(a) the adhesive layer comprises an adhesive which comprises at least one acrylate-based copolymer comprising 40 to 99% by mass of a butyl acrylate unit and 1 to 20% by mass of at least one monomer unit having a crosslinking functional group and at least one crosslinking agent;

(b) the adhesive layer having a gel fraction of 90% or greater;

c) a holding power to the plastic sheet as an adherend is 70,000 seconds or greater as measured in accordance with a method of Japanese Industrial Standard Z0237;

d) an adhesive strength to the plastic sheet as an adherend is 0.05 to 2.0 N/25 mm as measured in accordance with a method of Japanese Industrial Standard Z0237 before being heat pressed;

(e) an adhesive strength to the plastic sheet as an adherend is 0.1 to 4.0 N/25 mm as measured in accordance with a method of Japanese Industrial Standard Z0237 after being attached to the plastic sheet and heat pressed for 30 minutes under conditions of a temperature of 180° C. and a pressure of 4.3 N/mm$^2$; and (f) a shear value after heat pressing the release process film and the plastic sheet is 50 μm or smaller, said shear value being determined by attaching a face of the adhesive layer of the release process film to the plastic sheet, wherein the release process film has four corners and a size of 20 cm×20 cm and the plastic sheet has a size of 22 cm×22 cm as an adherend, forming through holes having a diameter of 6 mm in the plastic sheet at the four corners of the release process film, heat pressing the release process film and the plastic sheet for 30 minutes under the conditions of a temperature of 180° C. and a pressure of 4.3 N/mm$^2$, measuring shears between the release process film and the adherend at the four corners and obtaining an average of measured shears at the four corners as a measurement of the shear value.

29. The release process film in combination with the flexible circuit board according to claim 28, wherein the base material film is polyethylene terephthalate film; the monomer forming the monomer unit having a crosslinking functional group is 2-hydroxyethyl methacrylate; and the crosslinking agent is a tolylene diisocyanate-based crosslinking agent.

30. The release process film in combination with the flexible circuit board according to claim 29, wherein the acrylate-based copolymer further comprises methyl methacrylate as another monomer unit.

31. The release process film in combination with the flexible circuit board according to claim 30, which further comprises a metal chelate-based crosslinking agent.

32. The release process film in combination with the flexible circuit board according to claim 31 wherein an amount of a residual solvent in the adhesive layer is 2 µg/cm$^2$ or less.

33. The release process film in combination with the flexible circuit board according to claim 28, wherein the base material film is polyethylene terephthalate film; the monomer forming the monomer unit having a crosslinking functional group is 3-hydroxypropyl methacrylate; and the crosslinking agent is a tolylene diisocyanate-based crosslinking agent.

34. The release process film in combination with the flexible circuit board according to claim 33, wherein the acrylate-based copolymer further comprises methyl methacrylate as another monomer unit.

35. The release process film in combination with the flexible circuit board according to claim 34, which further comprises a metal chelate-based crosslinking agent.

36. The release process film in combination with the flexible circuit board according to claim 35, wherein an amount of a residual solvent in the adhesive layer is 2 µg/cm$^2$ or less.

* * * * *